(12) United States Patent
Wang et al.

(10) Patent No.: US 8,972,829 B2
(45) Date of Patent: Mar. 3, 2015

(54) METHOD AND APPARATUS FOR UMBRELLA CODING

(71) Applicant: Broadcom Corporation, Irvine, CA (US)

(72) Inventors: Zhongfeng Wang, Irvine, CA (US); Hongtao Jiang, Tustin, CA (US); Chung-Jue Chen, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 98 days.

(21) Appl. No.: 13/693,861

(22) Filed: Dec. 4, 2012

(65) Prior Publication Data

US 2014/0122976 A1    May 1, 2014

Related U.S. Application Data

(60) Provisional application No. 61/720,267, filed on Oct. 30, 2012.

(51) Int. Cl.
*H03M 13/00* (2006.01)
*H03M 13/15* (2006.01)

(52) U.S. Cl.
CPC ........ *H03M 13/1515* (2013.01); *H03M 13/611* (2013.01); *H03M 13/6516* (2013.01); *H03M 13/153* (2013.01); *H03M 13/1545* (2013.01); *H03M 13/1585* (2013.01)
USPC ............................ 714/776; 714/774; 714/758

(58) Field of Classification Search
CPC ............................. H04L 1/0057; H04L 1/0061
USPC .......... 714/776, 758, 795, 796, 757, 783, 774
See application file for complete search history.

(56) References Cited

U.S. PATENT DOCUMENTS

| | | | |
|---|---|---|---|
| 7,397,400 B2 * | 7/2008 | Miller | 341/67 |
| 7,630,456 B2 * | 12/2009 | Mogre et al. | 375/308 |
| 7,752,039 B2 * | 7/2010 | Bessette | 704/223 |
| 7,966,548 B2 * | 6/2011 | Jacobsen et al. | 714/774 |
| 8,059,745 B2 * | 11/2011 | Lee et al. | 375/267 |
| 8,527,853 B2 * | 9/2013 | Lakkis | 714/783 |

OTHER PUBLICATIONS

Chen, Bainan, et al., "*Error Correction for Multi-Level Nand Flash Memory Using Reed-Solomon Codes*", IEEE, SiPS, 2008, pp. 94-99.
Miller, R.L., et al., "*Fast Algorithm for Encoding the (255,223) Reed-Solomon Code Over GF $(2^8)$*", Electronics Letters, Mar. 13, 1980, vol. 16, No. 6, pp. 222-223.
Sarwate, Dilip V., et al., "*High-Speed Architectures for Reed-Solomon Decoders*", IEEE Trans. on VLSI Systems, vol. 9, No. 5, Oct. 2001, pp. 641-655.

* cited by examiner

*Primary Examiner* — Fritz Alphonse
(74) *Attorney, Agent, or Firm* — Brinks Gilson & Lione

(57) ABSTRACT

A communication system and a method are provided. The communication system includes an encoder configured to encode source data and output an encoded frame including a mother code or a plurality of concatenated daughter codes based on an encoding option. The mother code and the plurality of concatenated daughter codes have a same number of coded data symbols. The mother code includes a first source number of source symbols and a first parity number of parity symbols. The daughter code includes fewer source symbols and fewer parity symbols than the mother code.

20 Claims, 5 Drawing Sheets

METHOD AND APPARATUS FOR UMBRELLA CODING

CROSS REFERENCES TO RELATED APPLICATIONS

This application claims the benefit of pending U.S. Provisional Application No. 61/720,267, entitled "Method and Apparatus for Umbrella Coding" and filed on Oct. 30, 2012, the entirety of which is incorporated herein by reference.

TECHNICAL FIELD

This disclosure relates generally to communication. More particularly, it relates to communication systems capable of umbrella coding.

BACKGROUND

In a digital communication system, data transmitted may be digital messages originating from a data source, for example a computer server, a mobile device, or a keyboard. The communication channel between the data sources may be unreliable or noisy. Thus, forward error correction (FEC) or channel coding is introduced to control errors in data transmission. By using FEC, the sender encodes their message in a redundant way by using an error-correcting code (ECC). The redundancy allows the receiver to detect a limited number of errors that may occur anywhere in the message, and often to correct these errors without retransmission.

BRIEF DESCRIPTION OF THE DRAWINGS

The innovation may be better understood with reference to the following drawings and description. In the figures, like reference numerals designate corresponding parts throughout the different views.

DETAILED DESCRIPTION

The description below relates to a communication system capable of umbrella coding. A communication system may adopt analog transmission or digital transmission. While analog transmission is the transfer of a continuously varying analog signal, digital communications is the transfer of discrete messages. In a digital communication system, data is transferred over a point-to-point or point-to-multipoint communication channel. Examples of such channels are copper wires, optical fibers, wireless communication channels, and storage media. The data are represented as an electromagnetic signal, such as an electrical voltage, radio wave, microwave, or infrared signal.

In digital communication systems, it may be desirable to provide various tradeoffs between system performance, latency, and power consumption. For FEC, the coding gain will increase monotonically as the block size increases. On the other side, the processing latency (including latency for data encoding, receiving, and decoding) will increase monotonically as the code size increases. Thus, a powerful FEC code may be desirable for bad channels and a fewer powerful or weak FEC code to reduce power consumption and latency may be desirable when channel is very good. In this disclosure, we introduce a novel coding scheme, named umbrella coding. The umbrella coding may use block codes such as Reed-Solomon (RS) codes and Bose, Chaudhuri, and Hocquenghem (BCH) codes. The umbrella coding may be implemented in a communication system including computer servers, mobile devices, or other computation devices having hardware processors.

Figure 1:
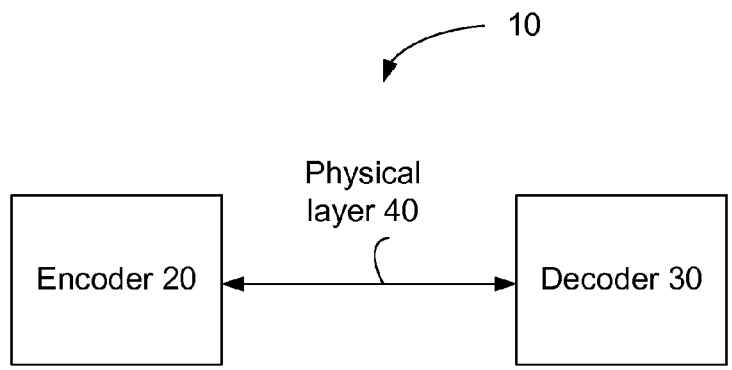
FIG. 1 is a block diagram of an example of a communication system.

FIG. 1 is a block diagram of an example of a communication system 10. The communication system 10 includes an encoder 20 communicating with a decoder 30. The communication system 10 can include a physical layer 40 between the encoder 20 and the decoder 30. For example, the communication system may be a data center including a plurality of servers. The servers may include an encoder, a decoder, or both the encoder and the decoder. The servers may communicate with each other via a backplane connection or coaxial cables. The servers may communicate with each other at a preset data rate at about 40 Gigabit per second, 100 Gigabit per second, or higher. The communication system 10 is configured to implement umbrella coding in the encoder 20 and the decoder 30. It should be noted that umbrella coding may be implemented in any communication system with a noisy channel.

Umbrella coding is a general coding scenario that may be a block based coding scheme. Umbrella coding provides multiple coding options (or encoder modes). For example, an embodiment of the umbrella coding includes a mother code which can include the largest code size for given FEC code options. The mother code may be used when the channel quality is low. The umbrella coding includes a plurality of daughter codes that may be combined to form an encoded data frame. The daughter codes include a smaller code size than the mother code. The daughter code mode may be used when the channel quality is relatively good.

Figure 2:
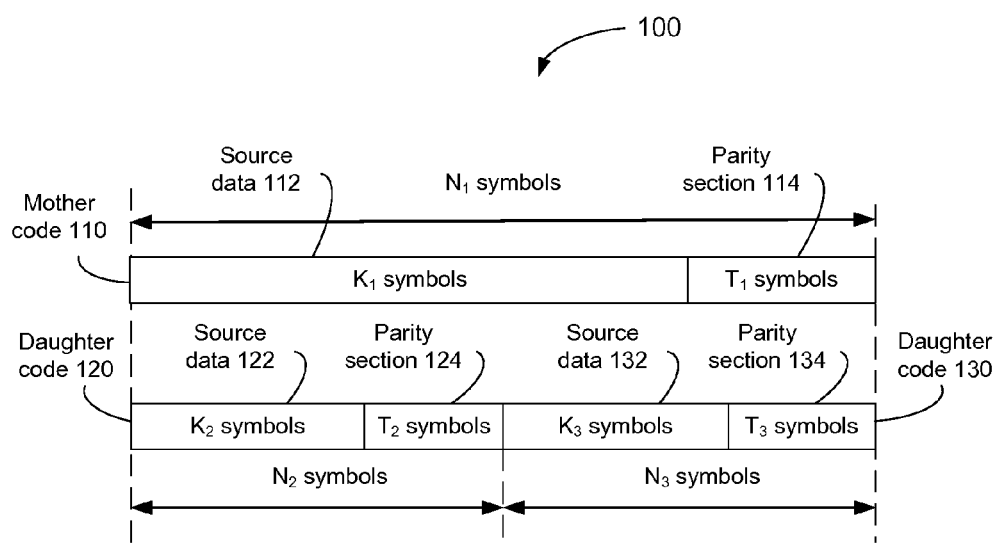
FIG. 2 is a block diagram of an example of an umbrella code set.

FIG. 2 is a block diagram of an example of an umbrella code set 100. In the example, the encoded frame may include a mother code 110 or a plurality of daughter codes 120 and 130. The encoded frame includes $N_1$ symbols. The mother code 110 has the largest code size when compared to the daughter codes 120 and 130, and the mother code 110 and daughter codes 120 and 130 include a fixed redundancy ratio. For example, the mother code includes a total of $N_1$ coded symbols. The mother code 110 includes a source data section 112 that has a first source number ($K_1$) of source symbols. The mother code 110 also includes a parity section 114 that has a first parity number ($T_1$) of parity symbols.

In an embodiment, an umbrella code set may be implemented for a given target data rate, e.g., 100 Gbps. The umbrella code set may need to ensure that coding options generate a same coded data rate. Thus, at a receiver side, the hardware overhead for decoding different RS codes in the code set may be minimized.

The umbrella code set 100 may have one or more kind of daughter codes. In one example, the daughter codes 120 and 130 respectively include $N_2$ and $N_3$ symbols. The daughter code 120 includes source data 122 having $K_2$ source data symbols and parity section 124 having $T_2$ parity symbols. The daughter code 130 includes source data 132 having $K_3$ source data symbols and parity section 134 having $T_3$ parity symbols. Multiple serially concatenated daughter codes make one frame of the mother code, i.e., $N_1=N_2+N_3$.

In an embodiment, the total number of source data symbols in a mother code 110 is the same as the total number of source data symbols in the plurality of daughter codes, i.e. $K_1=K_2+K_3$. The length of daughter codes may be the same or different. For example, the two daughter codes 120 and 130 may have the same number of coded data and source data, i.e. $N_2=N_3$ and $K_2=K_3$. The two daughter codes 120 and 130 may also have the same number of parity symbols, i.e. $T_2=T_3$. In other words, the two daughter codes 120 and 130 have the same error correcting capability. In some embodiments, the daughter codes may have at least one of the following: different numbers of coded data, different error correcting capabilities, different redundancy ratios.

For the sake of explanation, the umbrella coding includes one type of daughter code and the daughter code includes half the size of the mother code and the error correct capability of daughter code is also half that of mother code while all the FEC codes may be RS or BCH codes defined in the same finite field. In an embodiment, the two daughter codes 120 and 130 have the same number of coded data, source data, parity symbols, i.e. $N_2=N_3=N_1/2$, $K_2=K_3=K_1/2$, and $T_2=T_3=T_1/2$. In other examples, more types of daughter codes and different sized daughter codes can be used.

In an embodiment, all daughter codes have equal or similar code length, equal or similar error correcting capability. Both encoding and decoding of any daughter code is done within an integer number of cycles with a fixed bus width. In this way, encoding and decoding hardware can be maximally shared between two modes: 1) mother code mode and 2) daughter code mode. Thus, the overall hardware in the encoder or decoder will be minimally increased compared to that used for processing the mother code only. The umbrella coding scheme may have multiple modes. However, using two modes may give a good tradeoff between flexibility and hardware complexity.

For instance, an example of the umbrella code set including the following three FEC codes:
Mother code: RS(448,416, t=16, m=10),
Daughter code: RS(224,208, t=8, m=10),
Granddaughter code: RS(112,104, t=4, m=10),
In the above, RS(n, k, t, m) denotes a Reed-Solomon code, n is the number of coded symbols, k is the number of source symbols, t indicates error correction capacity, which is the guaranteed correctable number of error symbols, m is the polynomial order to generate finite field. Note that for an RS code with an error correction capacity t, it has 2*t parity symbols in general. In this example, the above three RS codes have same redundancy rate. In addition, the daughter code is half size of the mother code and the granddaughter code is half size of the daughter code.

The mother code includes a first source number (416) of source symbols and a first parity number (32) of parity symbols. The daughter code includes a second source number (208) of source symbols and a second parity number (16) of parity symbols. The granddaughter code includes a third source number (104) of source symbols and a third parity number (8) of parity symbols. Thus, a ratio between the first source number (416) and the second source number (208) equals a ratio between the first parity number (32) and the second parity number (16). A ratio between the first source number (416) and the third source number (208) equals a ratio between the first parity number (32) and the third parity number (16). In some embodiments, the ratio may not be exactly equal, but the ratios are very close to each other if they are not equal.

To decode the three RS codes at decoder side, the decoder mainly needs hardware to decode the mother code RS(t=16). For the daughter code RS(t=8), the decoder may activate (least significant part) half of the hardware. For the granddaughter code RS(t=4), the decoder may activate a quarter of the hardware for decoding. At encoder side, the overall hardware may be slightly larger than that used for encoding the mother code RS(t=16).

Figure 3:
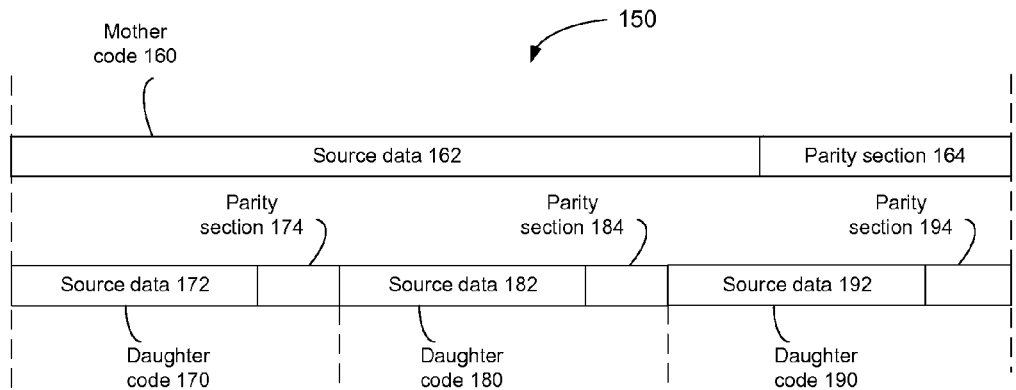
FIG. 3 is a block diagram of another example of an umbrella code set.

FIG. 3 is a block diagram of another example of umbrella code set 150. In the example, the encoded frame may include a mother code 160 or three daughter codes 170, 180, and 190. The mother code has a source data section 162 and a parity section 164. The daughter code 170 has a source data section 172 and a parity section 174. The daughter code 180 has a source data section 182 and a parity section 184. The daughter code 190 has a source data section 192 and a parity section 194. Each of the daughter codes 170, 180, and 190 includes fewer source symbols and fewer parity symbols than the mother code 160.

For example, in a 100G-KR4 system based on non-return-to-zero (NRZ) modulation, a mother code RS(528, 514, t=7, m=10) is adopted. The daughter codes in the umbrella code set may include:

A. All daughter codes use RS(t=2) codes and thus all the daughter codes have equal error correction capacity. The three daughter codes 170, 180, and 190 fill one mother code block and may be selected as RS(176, 171, t=2), RS(176, 172, t=2), and RS(176, 171, t=2). The three daughter codes 170, 180, and 190 may be concatenated in any order. For RS(176, 171, t=2), there are 5 parity symbols. There are many ways to generate the 5th parity symbol while an RS(t=2) encoder will generate first four parity symbols. If the bus width is 160 bits, it may take eleven cycles to receive one daughter code.

B. All daughter codes use RS(t=3) codes. The umbrella code set may include two daughter codes selected as RS(272, 265, t=3) and RS(256, 249, t=3). For either daughter code, an RS(t=3) encoder will generate first six parity symbols. The seventh parity symbol may be generated in a variety of ways. For example, the seventh parity symbol may be obtained by multiplying the normal RS code generate polynomial, g0(x), by (x+1) or (x+c), where c may be any element in the finite field that the RS code was defined. It may take seventeen cycles to receive RS(272, 265) coded data and take sixteen cycles to receive RS(256, 249) coded data.

C. The three daughter codes 170, 180, and 190 are selected as RS(176, 172, t=2), RS(176, 172, t=2), RS(176, 170, t=3, m=10). In this example, the daughter codes do not have the same number of parity symbols. However, the number of parity symbols in the different daughter codes are very close For example, in a 100 Gbase-KP4 system based on 4-level pulse amplitude modulation (PAM-4), a mother code RS(544, 514, t=15, m=10) is selected. The daughter codes in an umbrella code set may include:

A. All daughter codes use RS(t=5) codes. RS(176,166, t=5, m=10), RS(176, 166, t=5, m=10), and RS(192, 182, t=5, m=10). In this case, for a given size of FEC block, e.g., 5440 bits, only limited integer numbers are its factors. Accordingly, the integer factors such as 160, 340, and 170 may be chosen as the bus width in the encoder and decoder. For example, if the bus width is chosen as 160 bits, both mother code and daughter code can be encoded and decoded in an integer number of cycles. The mother code RS(544, 514, t=15, m=10) may be encoded and transmitted in (5440/160=34)+X1 cycles. The daughter code RS(176,166, t=5, m=10) may be encoded and transmitted in (1760/160=11)+X2 cycles. The daughter code RS(192, 182, t=5, m=10) may be encoded and transmitted in (1920/160=12)+X3 cycles. X1, X2, and X3 are integers.

B. All daughter codes use RS(t=7) codes. The umbrella code set may include two daughter codes selected as RS(272, 257, t=7) and RS(272, 257, t=7). For either daughter code, an RS(t=7) encoder will generate the first fourteen parity symbols. The fifteenth parity symbol may be generated in a variety of ways as described before. For example, the fifteenth parity symbol may be obtained by multiplying the RS(t=7) code generate polynomial by (x+c), where c may be any element in the finite field that the RS code was defined. In this case, if the bus width is chosen as 160$b$, both the mother code and daughter code may be encoded and transmitted in an integer number of cycles because 160 is a common factor of 5440 and 2720.

C. The umbrella code set may include six daughter codes. RS(96, 90, t=3), RS(112, 106, t=3), RS(112, 106, t=3), RS(112, 106, t=3), RS(112, 106, t=3), and RS(112, 106, t=3).

Once an umbrella code set is chosen, the corresponding encoder and decoder circuit may be designed accordingly. For high-speed applications, parallel encoding and parallel decoding may be required in the encoder and decoder.

In an embodiment, the encoder is configured to compute 2*t syndromes for the source data. The encoder allocates hardware to accommodate the mother code encoding. The encoder uses part of its hardware to encode the daughter codes because the daughter code comprises fewer source symbols and fewer syndromes than the mother code. For example, t_d may be fewer than t_m, where t_d and t_m denote error correction capacities for mother code and daughter codes respectively. Using the disclosed encoding/decoding scheme, the overall latency related to daughter codes compared to that related to mother code roughly equals t_d/t_m.

After syndrome is computed, the encoder may employ Lagrange interpolation to compute 2*t parity symbols. This part is different for mother code and daughter codes and the hardware sharing may thus be limited for this part involving Lagrange interpolation.

Figure 4:
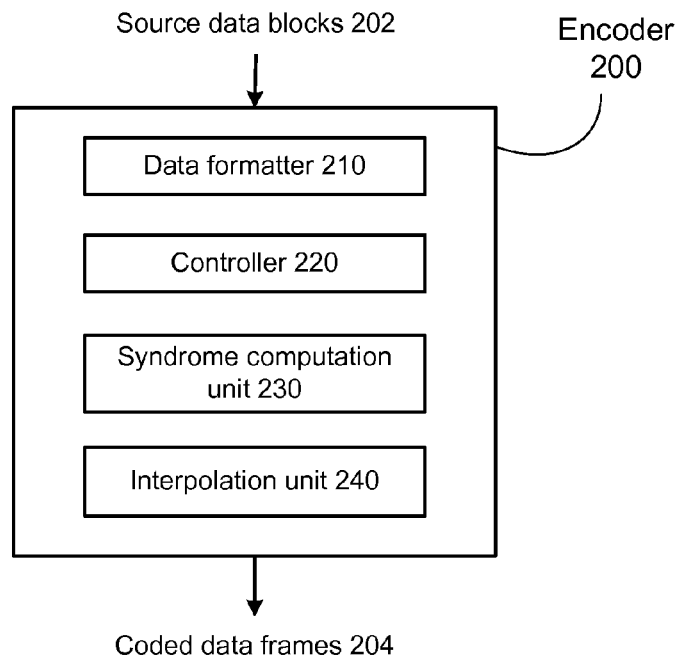
FIG. 4 is a block diagram of an example of an encoder.

FIG. 4 is a block diagram of an example of an encoder 200. The encoder 200 receives source data blocks 202 and output coded data frames 204. The encoder 200 includes a forward error correction circuit configured to encode the received source data blocks 202. For example, the encoder 200 is configured to encode a source data block 202 and output an encoded frame 204 including a mother code when the source data block 202 includes a first source number of source symbols. The encoder 200 is further configured to encode a plurality of source data blocks 202 and output an encoded frame 204 that includes a plurality of concatenated daughter codes. The encoder may determine which code to use based on an encoding option. The encoding option may be preset by a user or determined dynamically based on system performance parameters.

In an embodiment, the encoder 200 includes a data formatter 210, a controller 220, a syndrome computation unit 230, and a Lagrange interpolation unit 240. The encoder 200 may include other circuit or additional hardware. The data formatter 210 is configured to format the received source data blocks 202 for parallel encoding. The controller 220 is configured to determine the encoding option based on system performance parameters. The system performance parameter may include at least one of the following parameters about the communication system: latency requirement of the communication system, signal to noise ratio of the channel, and power consumption threshold for the encoder.

The syndrome computation unit 230 is configured to generate syndromes based on source symbols in a source data block. For example, when a mother code RS(528, 514, t=7, m=10) is adopted in the umbrella code set, the received source data block includes 514 source symbols. The syndrome computation unit 230 generates 14 syndromes based on the 514 source symbols. To encode a daughter code RS(176, 171, t=2), the syndrome computation unit 230 generates 4 syndromes based on the 171 source symbols.

Figure 5:
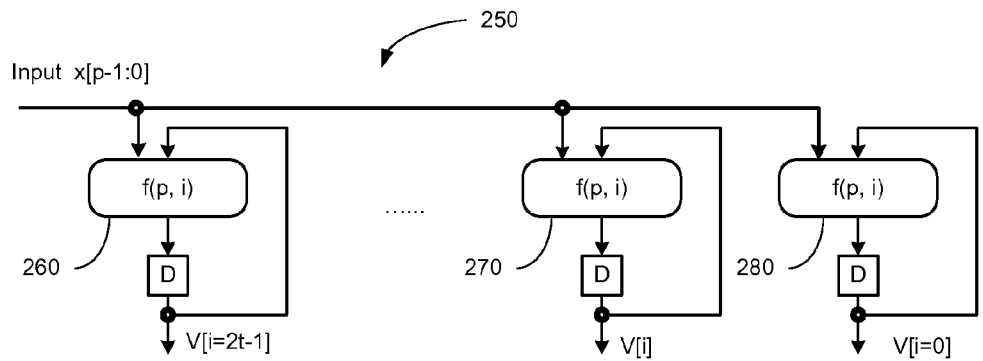
FIG. 5 is a block diagram of an example of a syndrome computation unit in an encoder.

FIG. 5 is a block diagram of an example of a syndrome computation unit 250 in an encoder. The syndrome computation unit 250 includes many combinatorial logics 260, 270, and 280. In an embodiment, the syndrome computation unit 250 may adopt a p-level parallel architecture for syndrome computation, which may be the same as the syndrome computation in a decoder except the data input. In this case, the input to the syndrome computation unit 250 includes all source data for a RS block. The registers in the syndrome computation unit will be reset to zero after encoding of a RS block.

In an embodiment, different RS codes with different "t" in an umbrella code set, a different percentage of hardware is used to compute the desired 2*t syndromes. Once the desired 2*t syndromes V(i) is obtained, the encoder may use Lagrange interpolation to compute 2*t parity symbols according to the following equation:

$$P(x) = \sum_{i=0}^{2t-1} V(i) * E_i(x) \quad (1)$$

Note in the above equation, for a given RS code with an error correction capacity "t," $E_i(x)$ may be pre-computed. Also, $E_i(x)$ has an order of "2*t−1". Hence, the second step involves straightforward "multiplication and addition" operations. It totally involves 2*t*2*t multiplication operations. This stage may be completed in one cycle or in multiple cycles depending on the required encoding latency. Normally, less hardware parallelism may lead to longer encoding latency.

In an embodiment, the required computation hardware at this stage for a specific RS code with error correction capacity "t" is proportional to "t*t." Thus, hardware sharing between mother code encoding and daughter code encoding is also feasible.

In an example for decoding, a decoder needs to perform three steps. The first step is for syndrome computation. This part of hardware is proportional to the error correction capacity "t." Similar to encoding, hardware may be shared between two modes. The second step is for a key equation solver. This part of hardware is also proportional to "t" in high speed applications. In addition, the number of iterations may also be proportional to "t." Thus, part of hardware is used for decoding daughter codes, and other parts need not be used. The third step is for Chien search and Forney algorithm. This part of hardware is roughly proportional to "t." Thus, part of hardware is activated or used for decoding daughter codes, and other parts need not be used. Due to much fewer valid symbols of daughter codes (e.g., 272 vs. 544), it takes much fewer cycles to finish this step for daughter codes.

Figure 6:
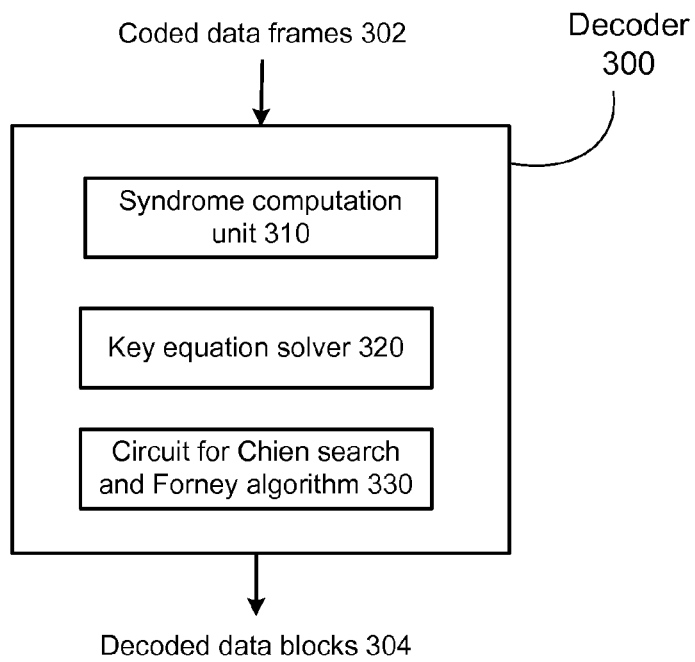
FIG. 6 is a block diagram of an example of a decoder.

FIG. 6 is a block diagram of an example of a decoder 300. The decoder 300 is configured to receive encoded data frames 302 and output decoded data blocks 304. The decoder 300 includes a syndrome computation (SC) unit 310, a key equation solver (KES) 320, and a circuit for Chien search and Forney algorithm (CSnF). For example, when the encoded data frame includes a mother code, the decoder 300 outputs a corresponding decoded data block. When the encoded data frame includes a plurality of concatenated daughter codes, the decoder 300 outputs many blocks of decoded data.

In an embodiment, if the mother code is selected as RS(528, 514, t=7, m=10) and the three daughter codes are selected as RS(176, 172, t=2), RS(176, 172, t=2), RS(176, 170, t=3, m=10), the decoder receives a coded data frame including 528 symbols and outputs a decoded data block including 514 symbols for a mother code. The decoder outputs three small data blocks including 172 symbols and 170 symbols per block when receiving a daughter code. Accordingly, the decoder activates less hardware when decoding the daughter code than when decoding the mother code. Here, a maximum difference of error correction capacity between any two daughter codes is less than equal to one.

Figure 7:
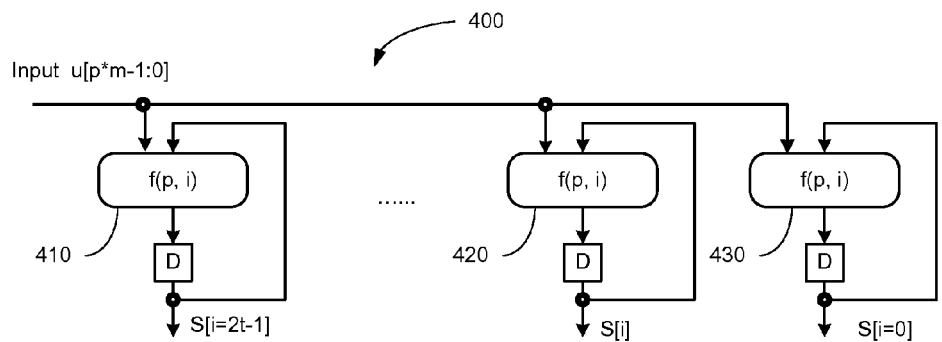
FIG. 7 is a block diagram of an example of a syndrome computation unit in a decoder.

FIG. 7 is a block diagram of an example of a syndrome computation (SC) unit 400 in a decoder. The SC unit 400 includes a p-parallel architecture includes many combinatorial logic 410, 420, and 430. In FIG. 7, m stands for RS symbol size, e.g., m=10, f(p, i) indicates the combinatorial logic which is a function of p and i, where p denotes parallelism level, i denotes the i-th power of the primitive element in the finite field that the RS code was defined.

In an embodiment for umbrella coding, the finite field is the same. For the same data rate, same clock frequency, the bus width may be the same. Thus the parallel-level, p, is same for any coding operation in the code set. The encoder that is configurable to encode the mother code and the daughter code uses the same bus width for input data and the same bus width for output data in two different modes.

For example, once the finite field (determined by finite field generator polynomial, e.g., x^10+x^3+1 for GF(2^10)) and parallel-level (determined by p) are fixed for a SC unit, the architecture to compute S[i], i=0, 1, . . . , 2*t−1, t<t_d+1, may be the same for different codes in the code set. Because the codes in an umbrella code set differ in error correction capability "t," computation of SC for a code with smaller t needs part of SC unit 400 designed for mother code. In an embodiment, each daughter code is transmitted in an integer number of cycles with same bus width to take advantage of sharing the encoder and decoder hardware. Thus, the decoder that is configurable to decode the mother code and the daughter code uses the same bus width for input data and the same bus width for output data in two different modes. Otherwise, the decoder may be more complicated.

Generally, encoder mode (mother code mode or daughter code mode) may be known at the receiver side through auto-negotiation process. For example, in Ethernet systems adopting the auto-negotiation procedure, two connected network devices choose common transmission parameters, such as speed, duplex mode, and flow control. The auto-negotiation procedure may allow connected network devices to negotiate the best possible shared mode of operation.

On the other hand, the encoder mode may also be known through blind decoding. This blind decoding may happen in a data training stage or in a regular data transmission stage. For example, the decoder may compute syndromes for mother code as data are coming in. At the end of first daughter code (i.e., after receiving exact amount of data as the first daughter code), the decoder checks whether the corresponding syndromes for that daughter code are zero or not.

If all syndromes for that daughter code are zero, the decoder resets registers for SC unit and computes syndromes for the second daughter code, et al. If two or any predetermined number of daughter codes all have zero syndromes, the decoder determines that encoder is in a daughter code mode. If not, we reset syndrome computation right before the next mother code block arrives.

If not all syndromes for the first daughter code are zero, the decoder continues syndrome computation for the mother code. If two or any predetermined number of mother codes have all-zero syndromes, the decoder determines that the encoder is in a mother code mode. Otherwise, the decoder repeats the process with next mother code block, i.e., a block of data having same size as a mother code.

Figure 8:
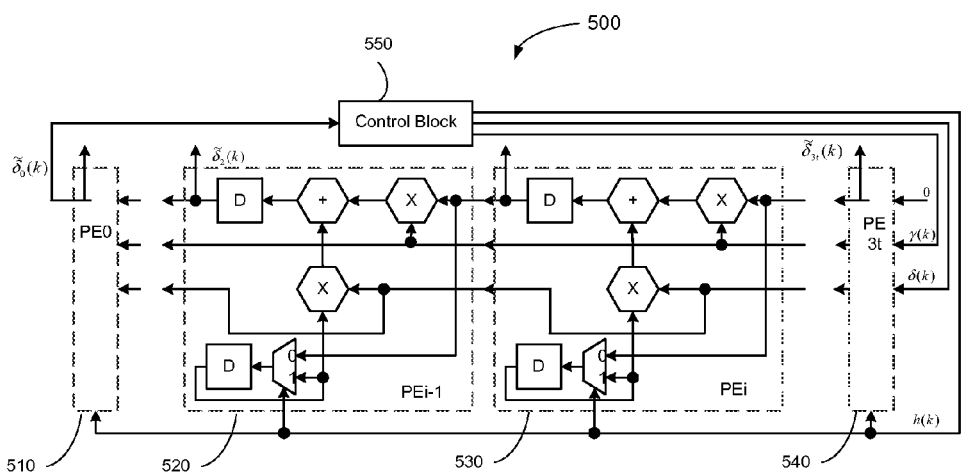
FIG. 8 is a block diagram of an example of a key equation solver in a decoder.

FIG. 8 is a block diagram of an example of a KES 500 in a decoder. The KES 500 includes many processing units 510, 520, 530, and 540. The KES 500 also includes a control block 550 connected to the processing units 510, 520, 530, and 540. For example, the KES 500 may be based on a Reformulated inversionless Berlekamp-Massey (RiBM) algorithm. In an embodiment, the KES 500 includes (3t+1) processing units for a mother code having error correction capacity "t." It may take 2*t cycles to finish the computation by the KES 500. For a daughter code in an umbrella code set, the KES 500 uses less hardware compared to decoding a mother code. In addition, it takes fewer cycles to finish computation due to a smaller t. In brief, the overhead for processing different codes in the umbrella code set is minimal.

Similarly, the circuit for CSnF has similar structure as the SC unit. The number of hardware units may be proportional to either t or t+1. The combinatorial logic is also related to parallel-level (p) and the specific finite field. Thus, for a daughter code, the circuit for CSnF can use part of hardware designed for mother code. Therefore, the decoder for a umbrella code-set needs minimal hardware overhead compared to that solely used for decoding the mother code.

Figure 9:
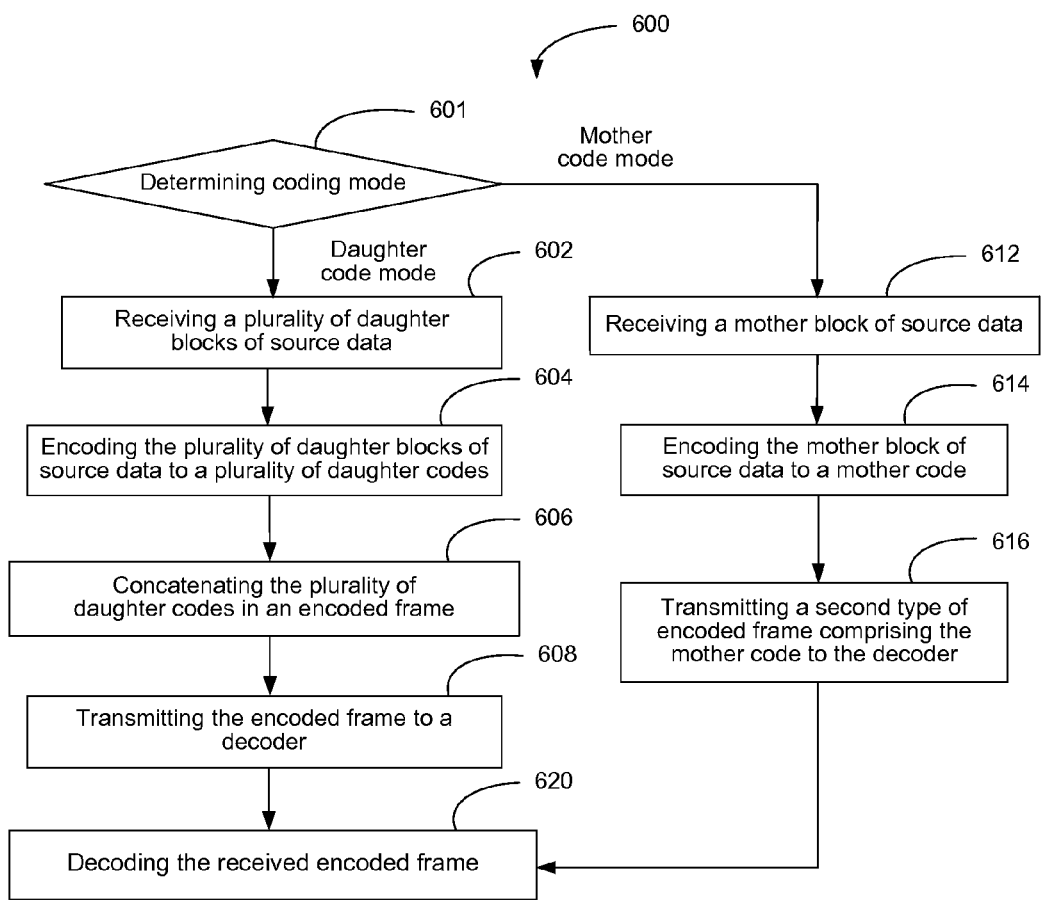
FIG. 9 is a block diagram of an example of a block diagram of a method in accordance with embodiments of umbrella coding.

FIG. 9 is a block diagram of an example of a block diagram 600 of a method in accordance with embodiments of umbrella coding. In this method, an encoder determines coding mode based on system performance parameters (601). The encoder may have a controller to adjust the coding mode dynamically. Alternatively or additionally, the encoder may determine the coding mode by detect a preset switch in the encoder.

When the determined coding mode is daughter code mode, the encoder receives a plurality of daughter blocks of source data (602). For example, the encoder may receive two daughter blocks of source data. The plurality of daughter blocks may have same number of source data symbols or different number of source data symbols. The encoder encodes the plurality of daughter blocks of source data to a plurality of daughter codes (604). The encoder may use part of its hardware when encoding the daughter codes, and need not use other parts.

After encoding, the encoder concatenates the plurality of daughter codes in an encoded frame (606) and transmits the encoded frame to a decoder (608). The encoder encodes the daughter codes within an integer number of cycles with a fixed bus width. The decoder then decodes the received encoded frame (620). The decoder may need to detect the encoder mode through an auto-negotiation process or using blind decoding.

When the determined coding mode is mother code mode, the encoder receives a mother block of source data (612). The mother block of source data have more source symbols than any daughter blocks. In an embodiment, the mother block of source data and the plurality of daughter blocks include the same total number of source symbols. The encoder receives a mother block of source data and encodes the mother block of source data to a mother code (614). With the encoded mother code, the encoder transmits the encoded frame including the mother code to the decoder (616). The encoded frame including the mother code may be referred as the second type of encoded frame compared with the first type of encoded frame including a plurality of daughter codes. In an embodiment, the mother code and the plurality of concatenated daughter codes have a same number of source data symbols and a same number of coded data symbols. The mother code includes a first source number of source symbols and a first parity number of parity symbols. The daughter code each includes fewer source symbols and fewer parity symbols than the mother code.

In an embodiment, during decoding, the decoder computes the first number of syndromes based on the transmitted encoded frame using the first number of syndrome computation units. The decoder computes the second number of syndromes based on the transmitted encoded frame using the second number of syndrome computation units. The decoder decodes the daughter code within an integer number of cycles.

The methods, devices, and logic described above may be implemented in many different ways in many different combinations of hardware, software or both hardware and software. For example, all or parts of the apparatus may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the apparatus described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability described above may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments of the systems and methods have been described, it will be apparent to those of ordinary skill in the art that many more embodiments and implementations are possible within the scope of the systems and methods. Accordingly, the systems and methods are not to be restricted except in light of the attached claims and their equivalents.

What is claimed is:

1. A communication system, comprising:
an encoder configured to encode source data and output, based on an encoding option, either: a) an encoded frame comprising a mother code having a first number of coded data symbols, or b) a plurality of concatenated daughter codes having a second number of coded data symbols; wherein:
the first number of coded data symbols and the second number of coded data symbols are equal;
the mother code comprises a first source number of source symbols and a first parity number of parity symbols; and
the daughter code comprises fewer source symbols and fewer parity symbols than the mother code.

2. The communication system of claim 1, wherein:
the daughter code comprises a second source number of source symbols and a second parity number of parity symbols; and
a ratio between the first source number and the second source number equals a ratio between the first parity number and the second parity number.

3. The communication system of claim 2, wherein the encoder comprises a forward error correction circuit configured to encode the source data.

4. The communication system of claim 2, wherein the encoder comprises a syndrome computation unit configured to generate a first syndrome number of syndromes based on the first source number of source symbols and generate a second syndrome number of syndromes based on the second source number of source symbols.

5. The communication system of claim 4, wherein the encoder is further configured to generate the first parity number of parity symbols by interpolating the first syndrome number of syndromes and generate the second parity number of parity symbols by interpolating the second syndrome number of syndromes.

6. The communication system of claim 1, further comprising:
a controller configured to determine the encoding option based on system performance parameters.

7. The communication system of claim 6, wherein the system performance parameters comprise:
latency requirement, signal to noise ratio, power consumption threshold, or any combination thereof.

8. The communication system of claim 1, wherein the daughter code and the mother code are both encoded within an integer number of clock cycles.

9. A communication system, comprising:
a decoder configured to receive an encoded frame comprising either: a) a mother code having a first number of coded data symbols or b) a plurality of serial concatenated daughter codes having a second number of coded data symbols, and output a block of decoded data; wherein:
the first number of coded data symbols and the second number of coded data symbols are equal; and
the decoder is configured to consume fewer computational resources when decoding the daughter code than when decoding the mother code.

10. The communication system of claim 9, wherein:
the mother code comprises a first source number of source symbols and a first parity number of parity symbols;
the daughter code comprises a second source number of source symbols and a second parity number of parity symbols; and a ratio between the first source number and the second source number equals a ratio between the first parity number and the second parity number.

11. The communication system of claim 9, wherein:
the decoder comprises a syndrome computation unit configured to generate a first syndrome number of syndromes based on the received mother code and generate a second syndrome number of syndromes based on the received daughter code;
a ratio between the first syndrome number and the second syndrome number is an integer; and
the first syndrome number and a summation of all the second syndrome numbers for daughter codes are equal.

12. The communication system of claim 9, wherein:
a maximum difference of error correction capacity between any two daughter codes is less than equal to one.

13. The communication system of claim 9, wherein the decoder further comprises a key equation solver comprising a plurality of processing units and configured to implement Reformulated inversionless Berlekamp-Massey algorithm.

14. The communication system of claim 13, wherein the key equation solver uses fewer processing units when decoding the daughter code than when decoding the mother code.

15. The communication system of claim 13, wherein the key equation solver finishes solving equations within fewer clock cycles when decoding the daughter code than when decoding the mother code.

16. The communication system of claim 15, wherein the daughter code is decoded within an integer number of clock cycles.

17. A communication method, comprising:
receiving, during a specific receiving operation in an encoder, either: a) daughter blocks of source data, or b) a mother block of source data;
encoding, in a specific encoding operation by the encoder, either: a) the daughter blocks of source data to daughter codes, or b) the mother block of source data to a mother code;
for encoding the daughter blocks:
concatenating the daughter codes into a first type of encoded frame; and
transmitting the first type of encoded frame to a decoder, wherein:
the mother code comprises a first source number of source symbols and a first parity number of parity symbols; and
each of the daughter code comprises fewer source symbols and fewer parity symbols than the mother code.

18. The communication method of claim 17, further comprising:
transmitting a second type of encoded frame comprising the mother code to the decoder, wherein:
the mother code and the concatenated daughter codes comprise and equal number of coded data symbols.

19. The communication method of claim 18, wherein:
the daughter code comprises a second source number of source symbols and a second parity number of parity symbols;
a ratio between the first source number and the second source number equals a ratio between the first parity number and the second parity number;
the daughter code is encoded by the encoder within a first integer number of clock cycles;
the daughter code is configured to be decoded by the decoder within a second integer number of clock cycles; and
the encoder uses a bus width for input data and a bus width for output data that are equal, in multiple different encoding modes.

20. The communication method of claim 18, further comprising:
when the first type of encoded frame is received at the decoder, computing, in the decoder, a first number of syndromes based on the first type of encoded frame; and
when the second type of encoded frame is received at the decoder, computing, in the decoder, a second number of syndromes based on the second type of encoded frame.

* * * * *